INVENTORS
KOICHI IKEDA
SHIGEZO TANAKA
KATSUJI MINAGAWA
BY
Hopgood & Calimafde
ATTORNEYS.

INVENTORS
KOICHI IKEDA
SHIGEZO TANAKA
BY KATSUJI MINAGAWA

Hopgood & Calimafde
ATTORNEYS

United States Patent Office 3,517,279

Patented June 23, 1970

3,517,279

FACE-BONDED SEMICONDUCTOR DEVICE UTILIZING SOLDER SURFACE TENSION BALLING EFFECT

Koichi Ikeda, Katsuji Minagawa, and Shigezo Tanaka, Tokyo, Japan, assignors to Nippon Electric Company, Limited, Tokyo, Japan, a corporation of Japan

Filed Sept. 18, 1967, Ser. No. 668,371

Claims priority, application Japan, Sept. 17, 1966, 41/61,822

Int. Cl. H01l 5/02

U.S. Cl. 317—234 5 Claims

ABSTRACT OF THE DISCLOSURE

An improved semiconductor device and method for making the same by the face-bonded technique, in which metallic layer electrodes of the semiconductor element and metallic layer terminals of a substrate to which the element is bonded are formed with a predetermined pattern configuration having dimensions related to the surface tension characteristics of the solder employed in the bonding process.

BACKGROUND OF THE INVENTION

As those knowledgeable in the art are aware, instead of connecting fine wires to electrodes of a semiconductor element such as a transistor or a semiconductor integrated circuit element, the so-called face-bonding method has been recently developed and utilized. According to this method, metallic terminals including a pattern corresponding to that of electrodes of a semiconductor element are provided on the surface of an insulating substrate and the semiconductor element is placed on the substrate face-to-face with the substrate surface; this is followed by bonding between the terminals of the substrate and the electrodes of the semiconductor element. This method is particularly effective when applied to an integrated circuit element having a number of electrodes. Further details of the face-bonding method are described in U.S. Pat. 3,292,240, granted Dec. 20, 1966 to R. D. McNutt et al., Pat. 3,303,393, granted Feb. 7, 1967 to I. M. Hymes et al., and Pat. 3,292,241, granted Dec. 20, 1966 to A. J. Carroll.

The requirement for the face-bonding method is that those portions of the electrodes of the semiconductor element and/or of the terminals of the substrate which are to be bonded should protrude over the remaining portions so that bonding may be easily conducted and so that the semiconductor element and the substrate may not make contact with each other except at the bonding portions. In order to meet this requirement, the conventional face-bonding method has used either a metallic ball attached to the bonding portion or an additional metallic layer plated to the bonding portion. Use of such a metallic ball or a plated layer, however, has required an additional and rather complicated process.

OBJECTS OF THE INVENTION

One of the objects of this invention is to improve the face-bonding method.

Another object of this invention is to provide a novel method of forming protrusions on the bonding portions of a semiconductor element and/or a substrate to be face-bonded to each other.

Still another object of this invention is to provide a face-bonded semiconductor device which can be assembled easily and inexpensively.

All of the objects of this invention and the manner of attaining them will become more apparent and the invention itself will best be understood by reference to the following description of the invention taken in conjunction with the accompanying drawings.

SUMMARY OF THE INVENTION

Figure 1A:
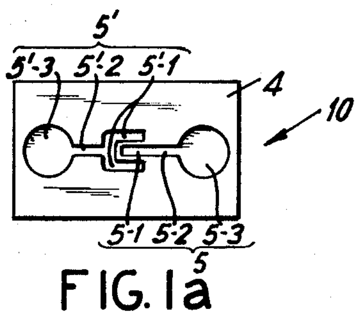
FIG. 1*a* is a plan view of a silicon transistor element having an electrode pattern according to this invention.

This invention is characterized by the use of a solder for the purpose of forming protrusions on bonding portions. In detail, metallic layers of electrodes of a semiconductors element and/or terminals of a substrate are formed with such a pattern that includes a narrow-width region and a wide-width region (for example, a circular region) continuous with the narrow-width region, and a fused solder is applied to the entire surface of these metallic layers. Since the fused solder thus applied rises, due to surface tension, up to a height determined generally by the width of the metallic layer, (more specifically up to a height, the maximum value of which is approximately half the width of the metallic layer), the wide-width region of the metallic layer has solder protruding as a result of the solder remaining on the narrow-width region to the extent determined by the difference in the width of the two regions, i.e., to a height approximately equal to half of this difference.

The electrodes of the semiconductor element and the terminals of the substrate, both or either of which are thus provided with protrusions of solder, are bonded to each other at these protrusions by being heated at a temperature higher than the fusing point of the solder, after which they are cooled to room temperature, to accomplish the face-bonding of the semiconductor element to the substrate. After the face-bonding, the height of the solder protrusion becomes somewhat less than the maximum height thereof before the face-bonding. However, the re-fused solder does not flow out of the bonding portions or the wide-width regions during heating in the face-bonding process. This is because the absolute value of the area of the bonding portion or the wide-width region is so small that the surface tension of the re-fused solder keeps the re-fused solder from flowing out. Thus, outflow of the solder which is generally considered possible is precluded and contacts of the solder between the portions other than the bonding portions and between the adjacent electrodes or terminals does not occur, even at a relatively high bonding temperature. Accordingly, face-bonding can be accomplished with extreme ease, by defining the pattern of the electrode and/or terminal as described above to form a protrusion of solder.

The maximum height of the protruding portion of the solder should have a preferred height not less than 15 microns compared with the remaining portion. In other words, the difference in width of the narrow-width region and the wide-width region is required to be not less than 30 microns in the pattern of the electrode and/or the terminal. The width or the diameter of the wide-width region must not be more than 2,000 microns, because the rising of the fused solder due to the surface tension will not occur when the width or the diameter exceeds this value.

In this invention, a semiconductor element may be made of silicon, germanium, a Group III–V compound semiconductor, or other semiconductor materials. Also, any type of semiconductor element, such as a transistor or a semiconductor integrated circuit, can be used. The substrate may be made of glass, ceramic, devitrified glass, or other insulating materials. A solderable metal such as gold, silver, copper, nickel, platinum, or an alloy of these metals is suitable for both the electrodes of the semiconductor element and the terminals of the substrate. However, both the electrodes and terminals may consist of a plurality of metal layers. In this case, it is preferable for the electrodes of the semiconductor element to form the lowermost layer by a metal having the characteristics both of a good ohmic contact with the semiconductor material of the semiconductor element and good adherence with the oxide of the semiconductor material of the semiconductor element, such as, if the element is made of silicon, aluminum, molydenum, titanium, chromium, or tungsten, and also to make the uppermost layer of a solderable metal film. It is also preferable to interpose between the terminal layer or layers and the substrate surface a film of a metal oxide such as tin oxide or lead oxide or other materials which serve to assure the contact of the two. The selected electrode and terminal materials, in any case, should be relatively insensitive to temperature during the soldering or bonding process.

Any metallic material having a melting point between approximately 100° C. and 520° C. can be used as the solder. Examples of preferred materials for the solder to be used in this invention are: an alloy of 42% indium and 58% tin (melting point —117° C.), indium (155° C.), a eutectic alloy of 62% tin and 38% lead (183° C.), an alloy of 75% lead and 25% copper (230° C.), an alloy of 95% tin and 5% antimony (232° C.), an alloy of 20% tin and 80% god (280° C.), an alloy of 90% lead, 5% tin and 5% silver (292° C.), an alloy of 95% lead and 5% tin (299° C.), an alloy of 97.5% lead and 2.5% silver (310° C.), an alloy of 75% gold and 25% indium (425° C.), and an alloy of 90% copper and 10% tin (516° C.). All percentages involved above are in weight. Among these or other solders, use of a solder of lower melting point is desirable in considering workability, while in consideration of reliability of the manufactured semiconductor device, use of a solder of higher melting point is preferable. Accordingly, a solder should be selected with these factors in mind.

It is convenient that the application of a fused solder to the electrode or the terminal is carried out by dipping the element or the substrate into a solder bath. In this case, the temperature of the solder bath is preferably higher by 10–20° C. than the melting point of the solder being used. The time period of dipping is recommended to be within the range from 4 to 30 seconds, though it depends on the temperature of the bath. However, a higher temperature and a longer time period than the above have no effect on the formation of the solder protrusion.

Figure 1B:
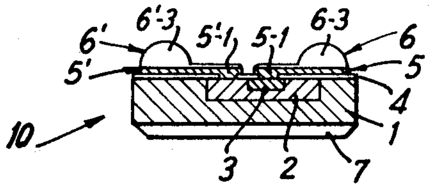
FIG. 1*b* is a cross-sectional view of the transistor element of FIG. 1*a* after being provided with the solder protrusions according to this invention.

Referring to FIGS. 1*a* and 1*b*, a planar-type transistor element 10 having a collector 1 of n-type, a base 2 of p-type and an emitter 3 of n-type is made of a silicon single crystal and one major surface of the crystal is covered with a silicon dioxide film 4 with windows open to a base and emitter, through the process broadly known in the art. Typically, the element 10 is of the order of 150$\mu$ in thickness and 600$\mu$ x 400$\mu$ in area. Aluminum is evaporated over the silicon dioxide film 4, and an aluminum film 0.6$\mu$ thick thus made is then photo-etched to form the electrode patterns 5 and 5' shown in FIG. 1*a*. Each pattern 5–5' includes a narrow region 5–1, 5'–1 making contact with the emitter 3 or base 2, another narrow region 5–2, 5'–2 being elongated from the narrow contact region, and a circular broad region 5–3, 5'–3 continuous to the narrow elongated region. Both the narrow contact and elongated regions are 10$\mu$ in width, while the diameter of the circular region 5–3, 5'–3 is 70$\mu$. The distance between the centers of the two broad regions 5–3 and 5'–3 is 150$\mu$. The emitter and base electrodes 5 and 5' are completed by chemically plating nickel of approximately 2$\mu$ in thickness and subsequently gold of approximately 0.2$\mu$ thick on the aluminum film.

The transistor element 10 is then dipped into fused indium kept at 180° C. for 10 seconds to deposit the indium solder 6 and 6' over the electrodes 5 and 5'. The deposited indium solder 6 or 6' rises up to approximately 5$\mu$ maximum height on the narrow regions 5–1 and 5–2 of the emitter electrode 5 or on the narrow regions 5'–1 and 5'–2 of the base electrode 5' and also protrudes up to approximately 35$\mu$ maximum height from the electrode surface on the broad region 5–3 of the electrode 5 or on the region 5'–3 of the electrode 5'. The solder protrusions 6–3 and 6'–3 thus formed are to be used in face-bonding. Over the bottom surface of the crystal, another solder layer 7 is provided, either at the same time as the deposition of indium solder 6 and 6' or by use of another solder such as tin-lead alloy solder.

Figure 2:
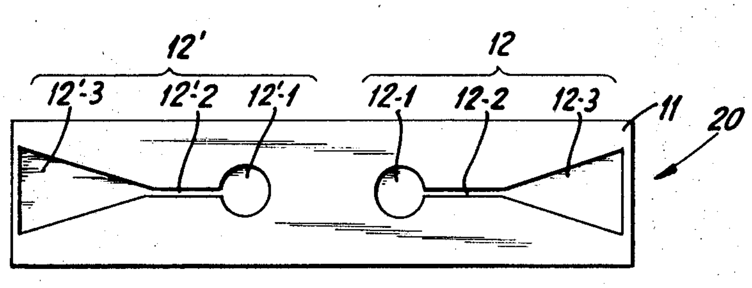
FIG. 2 is a plan view of a substrate for the transistor element of FIG. 1.

Referring to FIG. 2, a 500 angstrom-thick film of tin oxide is formed over the mirror-polished surface of a borosilicate glass substrate 11 200$\mu$ thick, 1 mm. wide and 5 mm. long. Nickel is chemically plated over the tin-oxide film up to a thickness of 3$\mu$. Then, the tin-oxide and nickel films are photo-etched so as to leave the terminal patterns 12 and 12' shown in FIG. 2. Each terminal pattern 12, 12' has a circular broad region 12–1, 12'–1 70$\mu$ in diameter, an elongated narrow region 12–2, 12'–2 10$\mu$ in width and 225$\mu$ in length, and a claviform region 12–3, 12'–3 of 500$\mu$ in maximum width and 2.2 mm. in length. The terminals 12 and 12' are then provided with a gold film 0.2$\mu$ thick by chemical plating on the nickel film and dipped for 10 seconds into a fused solder of 62% tin-38% lead (weight percentage) alloy kept at 220° C. As a result, the solder 13, 13' (see FIG. 3) is deposited over the terminal 12, 12'. Maximum height of the portions of the deposited solder 13, 13' on the circular region 12–1, 12'–1, the narrow region 12–2, 12'–2 and the claviform region 12–3, 12'–3 of the terminal 12, 12' are approxicately 35$\mu$, 5$\mu$, and 200–250$\mu$, respectively. Although the type of the solder deposited on the terminal 12, 12' is different from that on the electrode 5, 5' of the transistor element, there is no disadvantage to using the same solder on both the terminal and the electrode.

Figure 3:
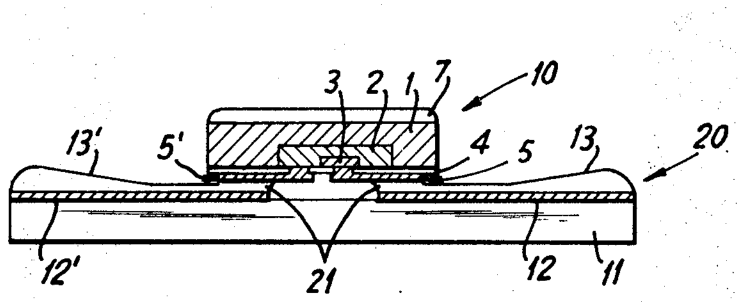
FIG. 3 is a cross-sectional view of an assembly made by face-bonding the transistor element of FIG. 1 to the substrate of FIG. 2.

FIG. 3 shows the assembly 30 made by face-bonding the transistor element 10 to the substrate 20. In more detail, the transistor elemnt 10 is placed on the substrate 20 so that the solder protrusions 6–3 and 6'–3 of the element 10 may make contact with the solder protrusions formed on the circular regions 12–1 and 12'–1 of the terminals. A reacting operation at 230° C. for approximately 5 seconds is next performed to fuse these solder protrusions. After cooling, the mixed solder 21 bonds the element 10 and the substrate 20 together.

Figure 4A:
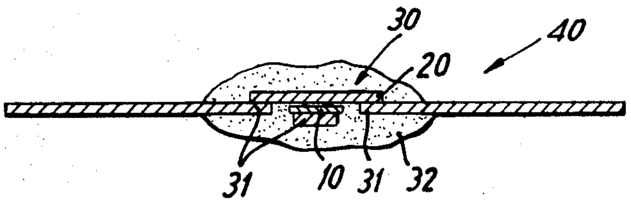
FIG. 4*a* is a cross-sectional view of an example of a face-bonded semiconductor device using the assembly of FIG. 3.
Figure 4B:
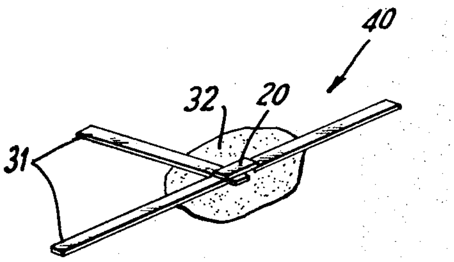
FIG. 4*b* is a perspective view of the device of FIG. 4*a*.

Referring to FIGS. 4*a* and 4*b*, each of the lead-out conductors 31 of tape form is connected to the solder layer 7 (see FIG. 3) of the transistor element 10 and to the solder protrusions formed on the claviform regions 12–3 and 12'–3 (see FIG. 2) of the terminal of the substrate 20. A face-bonded transistor device 40 is completed by molding the face-bonded assembly 30 with an epoxy resin 32.

In the other embodiments of this invention, face-bonded semiconductor integrated circuit devices are manufactured. Planar-type integrated circuit elements, which may be made of siilcon crystal by use of the techniques well known in the art, are provided with a plurality of electrodes consisting of an aluminum lowermost film 0.6$\mu$ thick, a nickel film 2$\mu$ thick and a gold uppermost film 0.2$\mu$ thick. These electrodes include contact portions 10$\mu$ wide which are connected to various circuit elements formed in the silicon crystal, broad portions either circular form having a 150μ diameter or rectangular form having a 150μ width which serve as bonding portions, and wiring regions 10μ wide which interconnect the contact regions to each other or to the broad regions. On the other hand, glass substrates are provided with a plurality of terminals consisting of a 2μ-thick lower film of nickel and 0.2μ-thick upper film of gold with the interposed 500 angstrom-thick layer of tin oxide.

The terminals include a first group of broad regions of either circular form having a 150μ diameter or rectangular form having a 150μ width which are distributed at the positions corresponding to that of the bonding portions of the electrodes on the integrated circuit element, a second group of broad regions which are positioned outside of the first group of broad regions and are to be connected to lead-out conductors, and wiring regions 10μ wide which interconnect the broad regions of the first and second groups. The techniques utilized in the field of printed circuit board manufacture may be useful in forming these terminals on the glass substrate.

The above integrated circuit elements and substrates are used in the following three embodiments, respectively.

(1) The integrated circuit element is dipped for about 10 seconds into fused indium kept at 180° C. Over the electrodes of the element, is thus formed an indium solder layer which rises up to approximately 5μ on the contact and wiring regions of the electrodes and also protrudes up to approximately 75μ on the broad regions. Without forming any solder layer on the terminals, the element and the substrate are face-bonded by being heated at 180° C. for about 10 seconds. After lead-out conductors are soldered to the broad regions of the second group of the substrate terminal, the face-bonded assembly is molded with an epoxy resin.

Figure 5:
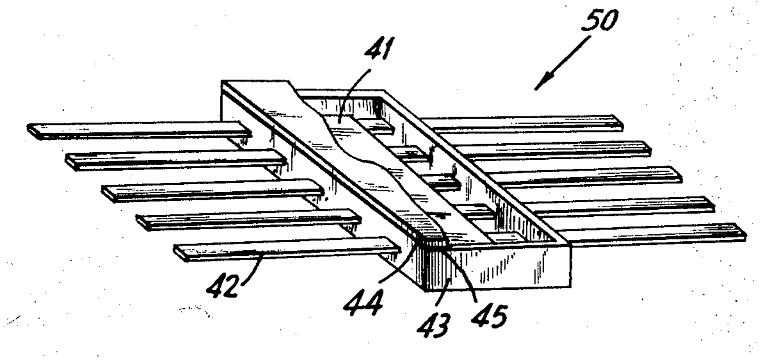
FIG. 5 is a perspective, partially exposed view of a face-bonded semiconductor integrated circuit device.

(2) The substrate with terminals is dipped for 5 seconds into a fused solder of 20% tin-80% gold (weight percentage) alloy kept at 300° C. Solder layers of 5μ maximum height and 75μ maximum height are thus formed on the wiring regions and the broad regions of the first group of terminals, respectively. Without providing the electrodes of the element with any solder layer, the element and the substrate are face-bonded by being heated at 300° C. for about 10 seconds. Referring to FIG. 5, the face-bonded assembly is placed in a glass container 43 and the broad regions of the second group of terminals of the substrate 41 are connected to lead-out conductors 42 which are preliminarily attached hermetically to the walls of the container 43. The container 43 is then hermetically sealed at approximately 400° C. with a covering plate 44 of ceramic, metal, or glass which is preliminarily glazed with a low melting point glass 45. A reliability test of the resultant integrated circuit device 50 has proved that the device 50 has a superior reliability compared with conventional devices.

(3) The protrusions of indium solder are formed on the electrodes of the element, and those of 20% tin-80% gold (weight percentage) alloy solder on the terminals of the substrate, according to the methods described above. The element and the substrate are face-bonded at 300° C.

for 10 seconds. Because of the use of indium solder which has a low melting point, the face-bonding process can be performed with extreme ease, but the face-bonded assembly cannot be sealed at higher temperature than 300° C. within a container.

While the principles of the invention have been described in connection with specific apparatus, it is to be clearly understood that this description is made only by way of example and not as a limitation to the scope of the invention as set forth in the objects thereof and in the accompanying claims.

What is claimed is:

1. A face-bonded semiconductor device comprising; a semiconductor element having a plurality of electrodes on the top thereof, an insulating substrate having a plurality of electrical terminals on the surface thereof face bonded to said electrodes at selected points, said electrodes and said terminals respectively comprising first and second contiguous broad and narrow regions, all of which regions are less than 2000 microns in width, layers of solder deposited in said first and second broad and narrow regions of said electrodes and said terminals, a quantity of said solder protruding from each of said regions a distance varying directly with the width thereof, said selected points being defined at said broad regions of said electrodes and said terminals respectively and positioned to coincide when said substrate and semiconductor element are face bonded, said semiconductor element, insulated substrate, and the remaining portions of said electrodes and said terminals being separated by a distance equal to the height of the solder protruding from said mating broad regions.

2. The semiconductor device of claim 1 wherein said broad regions of said electrodes and said terminals which are mated each comprise substantially disc-shaped areas.

3. The semiconductor device of claim 2 wherein said broad regions of said terminals on said insulating substrate include third broad regions contiguous with said second broad and narrow regions and defining means for mating with leads to said semiconductor device.

4. The semiconductor device of claim 3 wherein the bottom of said semiconductor element comprises an electrode for mating with a lead thereto.

5. The semiconductor device of claim 1, wherein each of said first and second broad regions are at least 30 microns greater in width than said narrow regions.

References Cited

UNITED STATES PATENTS

| | | | |
|---|---|---|---|
| 3,380,155 | 4/1968 | Burks | 29—591 |
| 3,287,610 | 11/1966 | Reber | 317—234 |
| 3,292,240 | 12/1966 | McNutt et al. | 29—155.5 |
| 3,344,323 | 9/1967 | Einthoven et al. | 317—235 |

JOHN W. HUCKERT, Primary Examiner

B. ESTRIN, Assistant Examiner

U.S. Cl. X.R.

317—235